United States Patent
Peng et al.

[11] Patent Number: 6,137,728
[45] Date of Patent: Oct. 24, 2000

[54] NONVOLATILE REPROGRAMMABLE INTERCONNECT CELL WITH PROGRAMMABLE BURIED SOURCE/DRAIN IN SENSE TRANSISTOR

[75] Inventors: Jack Zezhong Peng, San Jose; Volker Hecht, Los Altos; Robert M. Salter, III, Saratoga; Kyung Joon Han, Cupertino; Robert U. Broze, Santa Cruz, all of Calif.

[73] Assignee: GateField Corporation, Fremont, Calif.

[21] Appl. No.: 09/205,678

[22] Filed: Dec. 4, 1998

[51] Int. Cl.⁷ .................................................. G11C 16/04
[52] U.S. Cl. ............................ 365/185.28; 365/185.14; 257/321
[58] Field of Search ..................... 365/185.28, 185.21, 365/185.14; 257/321, 320

[56] References Cited

U.S. PATENT DOCUMENTS 5,761,120  6/1998  Peng et al. ........................ 365/185.14
5,838,040  11/1998  Salter et al. ........................... 257/321

*Primary Examiner*—David Nelms
*Assistant Examiner*—David Lam
*Attorney, Agent, or Firm*—Townsend and Townsend and Crew LLP; Henry K. Woodward

[57] ABSTRACT

Disclosed is a FPGA cell and array structure which use FN tunneling for program and erase. Each cell comprises a switch floating gate field effect transistor and a sense floating gate field effect transistor with the floating gates being common and the control gates being common. Programming of a cell is effected by voltage biasing the common control gate line and the source/drains of the sense transistor. The source/drains of the sense field effect transistor are formed from buried doped layers (e.g. N+ in a P-doped substrate) which are formed prior to formation of the polysilicon floating gate and control gate. Lateral diffusion of dopant from the buried source/drains into the channel beneath the floating gate facilitates electron tunneling during erase and program operations, and the graded junctions of the buried source/drains lower band-to-band tunneling leakage.

8 Claims, 5 Drawing Sheets

NONVOLATILE REPROGRAMMABLE INTERCONNECT CELL WITH PROGRAMMABLE BURIED SOURCE/DRAIN IN SENSE TRANSISTOR

This patent application is related to our co-pending patent application for Improved Nonvolatile Reprogrammable Interconnect Cell With Programmable Buried Bitline, which is incorporated herein by reference.

BACKGROUND OF THE INVENTION

The present invention is related to field programmable integrated circuits, especially Field Programmable Gate Arrays (FPGAs), and more particularly, to floating gate MOS transistors used as switching elements in an FPGA.

Typically, an FPGA has an array of logic elements and wiring interconnections with thousands, or tens of thousands, of programmable interconnects so that the FPGA can be configured by the user into an integrated circuit with defined functions. Each programmable interconnect, or switch, can connect two circuit nodes in the integrated circuit to make (or break) a wiring interconnection or to set the function or functions of a logic element.

FPGAs use either memory cells or antifuses for the programmable interconnect. memory cells are reprogrammable and antifuses are programmable only once. A new non-volatile memory-type of programmable interconnect is disclosed in U.S. Pat. No. 5,764,096, entitled, "A GENERAL PURPOSE, NON-VOLATILE REPROGRAMMABLE SWITCH," issued Jun. 9, 1998 by Robert J. Lipp, Richard D. Freeman, Robert U. Broze, John M. Caywood, and Joseph G. Nolan, III, and assigned to the present assignee. In the FPGA described in the patent application, a non-volatile reprogrammable transistor memory (NVM) cell is used to provide a general purpose switching element to randomly interconnect FPGA wiring and circuit elements. Basically an NVM cell has an MOS transistor with a floating gate which may be charged and/or discharged. Charging and/or discharging the floating gate provides for the non-volatile programmability feature of NVM technologies.

In an FPGA, indeed, in any integrated circuit, it is important that the elements of the FPGA be as compact as possible for an efficient layout of the circuit and be as easily manufactured as possible. U.S. Pat. No. 5,633,518 by Robert U. Broze, for "Non-Volatile Reprogrammable Interconnect Cell With FN Tunneling and programming" and assigned to the present assignee is directed toward highly compact cells of one of the programmable interconnects described in U.S. Pat. No. 5,764,096, supra. An efficient array of such interconnects, each of which is selectively programmable, is achieved. Each programmable interconnect cell has a first MOS transistor having first and second source/drains connected to first and second circuit nodes respectively, and a floating gate for turning the first MOS transistor off and on responsive to the amount of charge on the gate. The cell also has a tunneling device with one terminal connected to the floating gate of the first MOS transistor and coupled to a programming/erase line through a tunneling oxide layer, a control gate capacitively coupled to the floating gate, and at least one tunneling control line for controllably inhibiting tunneling through the oxide layer. The tunneling control line and the programming/erase line form a PN junction which is close to, but laterally displaced from, the region below the tunneling oxide layer. Under a reverse bias, the charge of depletion region of the junction extends through the region below the tunneling oxide to block tunneling. This permits each programmable interconnect to be selectively programmable.

Our U.S. Pat. No. 5,838,040 is directed to an improved FPGA cell and array structure with improved manufacturing yield, reliability, programming speed, threshold margining, and cost. The cell includes a gate switch transistor and a gate sense transistor having common floating gates, the sense transistor also providing the programing and erasing of the switch transistor by Fowler-Nordheim (FN) electron tunneling to and from the transistor drain and the floating gate. In an array of cells or an FPGA tile, two column lines are respectively connected to the source and drain regions of the sense transistors in each column for use in sensing the threshold voltage of the sense transistor and switch transistor and thus measuring the programmed or erased state of the switch transistor.

Use of the sense transistor for programming and erasing of the switch transistor can impact the sensing function of the transistor. The sense and switch transistors should be identical devices for accurate sensing, tight distribution, and simple circuitry and fabrication steps. However, the programming and erasing function has heretofore required a non-symmetric drain junction in the sense transistor for electron tunneling between the floating gate and the drain. This asymmetry is difficult to scale down and can result in non-uniform FN programming (electron tunneling) and localized stress on the tunnel oxide. Further, the drain requires a longer channel length for preventing punch through, resulting in a larger cell height. The structure in U.S. Pat. No. 5,838,040 has a symmetrical source/drain structure with electron tunneling from both source/drain regions to the floating gate. However, the source/drains are formed by gate self-aligned implant which necessitates electron tunneling from the edge of the source/drain and the floating gate.

Other limitations are created by the fabrication of the programming drain/polysilicon gate structure. As illustrated in section view in FIG. 1, the control gate 110 and floating gate 112 of a sense/programming transistor in silicon substrate 113 must overlap the drain 114 more than the overlap of the source to facilitate electron tunneling between the drain 114 and floating gate 112. Due to the overlap the drain doping is not uniform since ion implant 118 extends under the gate structures by ion migration during annealing, as illustrated at 120. Further, the non-uniform polysilicon gate structure which has curved or smiling bottom surfaces at the gate edges affects the drain junction edge programming speed and requires a higher bitline voltage which results in increased bitline disturb and leakage.

The present invention is directed to an improvement in the FPGA cell and array disclosed in U.S. Pat. No. 5,838,040.

SUMMARY OF THE INVENTION

In accordance with the invention, a nonvolatile reprogrammable interconnect cell includes a switch transistor and a sense transistor with programming of the cell provided by electron tunneling from the source/drains of the sense transistor to the floating gate of the cell. A feature of the invention is the use of buried doped (N+ or P+) regions in a semiconductor substrate for the source/drain regions of the sense 30 transistor. The buried regions are formed prior to formation of polysilicon floating gate and control gate structures, and dopant from the source/drain implant laterally diffuses into the channel under the floating gate during gate fabrication which later facilitates electron tunneling. Further, the graded junction of the buried bitline source/drain region provides low band-to-band tunneling leakage from the floating gate.

The invention and objects and features thereof will be more readily apparent from the following description and appended claims when taken with the drawings.

DETAILED DESCRIPTION OF PREFERRED EMBODIMENT

Figure 2:
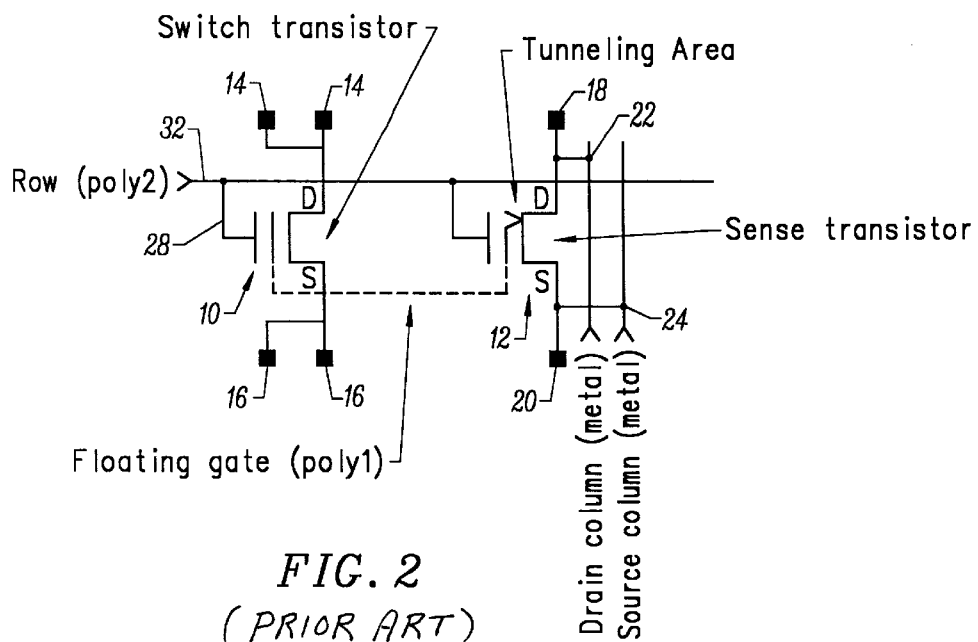
FIG. 2 is a schematic of an FPGA cell in accordance with the U.S. Pat. No. 5,838,040.

FIG. 2 is a schematic of an FPGA cell in accordance with U.S. Pat. No. 5,838,040 which includes a switch transistor 10 and a Fowler-Nordheim tunneling device and sense transistor 12. The switch transistor has contacts 14 and 16 connected respectively to the drain and source regions of the transistor, and sense transistor 12 has contacts 18 and 20 connected respectively to the drain and source regions of the transistor. The drain of the sense transistor is connected also to a drain column (metal) line 22, and the source is connected to a source column (metal) line 24. Column lines 22,24 are connected to all source and drain regions of sense transistors in one column. Switch transistor 10 and sense transistor 12 share a common floating gate 26 with the floating gate being positioned between control gate 28 of the switch transistor 10 and the control gate 30 of the sense transistor 12. The control gates are connected to a row (poly 2) line 32.

Figure 3:
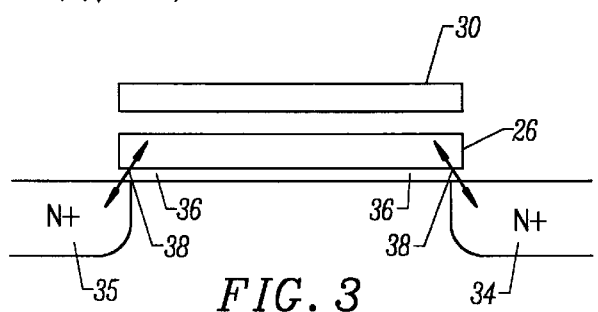
FIG. 3 is a section view of the sense transistor of FIG. 1.

As illustrated more clearly in the section view of the sense transistor in FIG. 3 floating gate 26 in the sense transistor is positioned in close abutment or overlap on the N+ doped drain 34 and/or source 35 of the sense transistor with special tunneling oxide 36 having a thickness on the order of 80 Å-120 Å separating floating gate 26 and N+ drain 34 to facilitate the tunneling of electrons between the floating gate and drain regions as indicated by the arrow 3 8. Thus erase of the FPGA cell occurs by electron tunneling to the floating gate from the drain source and channel regions. Programming of the FPGA cell occurs by electron tunneling from the floating gate to the drain and/or the source.

Figure 1:
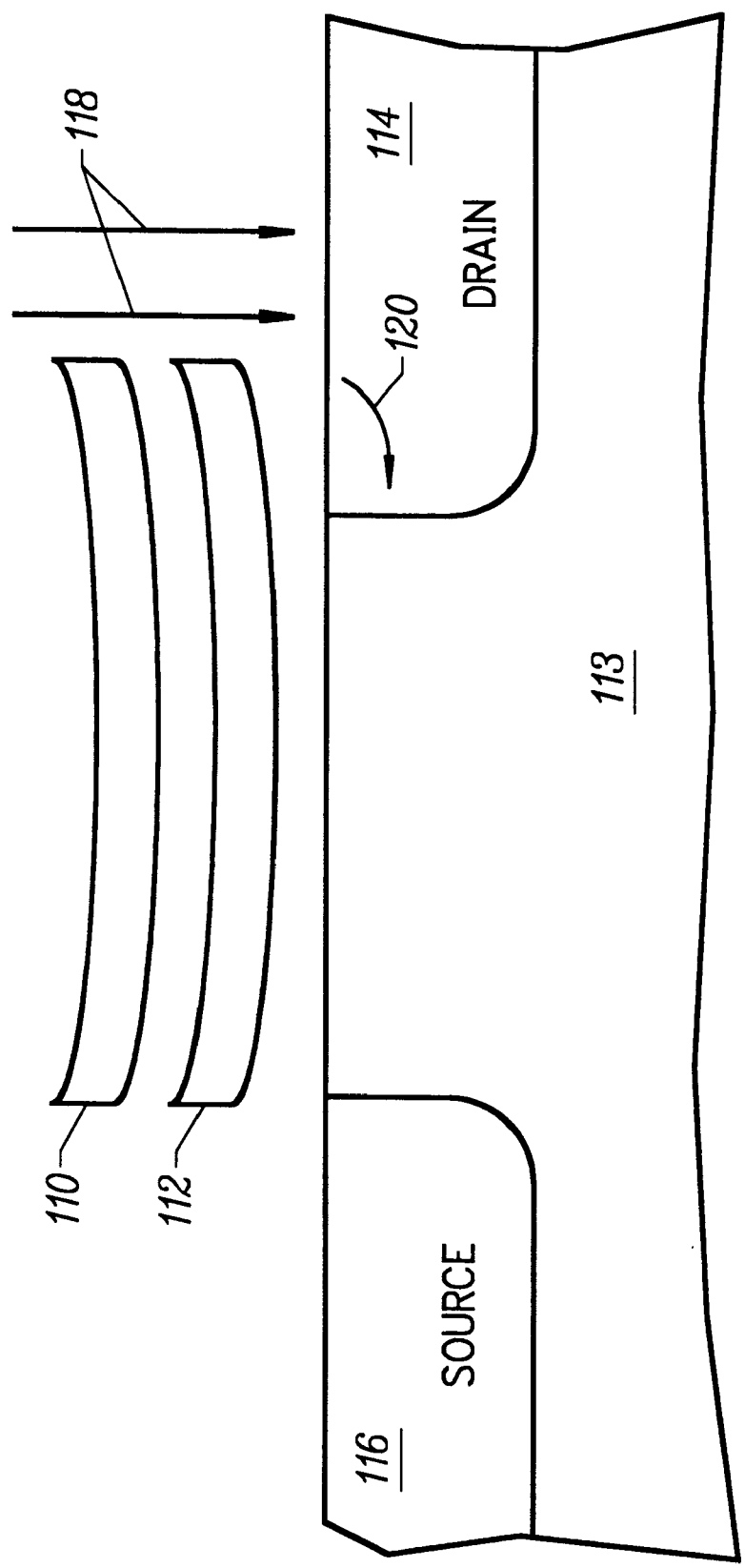
FIG. 1 is a section view illustrating the structure of a sense/programming transistor in accordance with the prior art.
Figure 4:
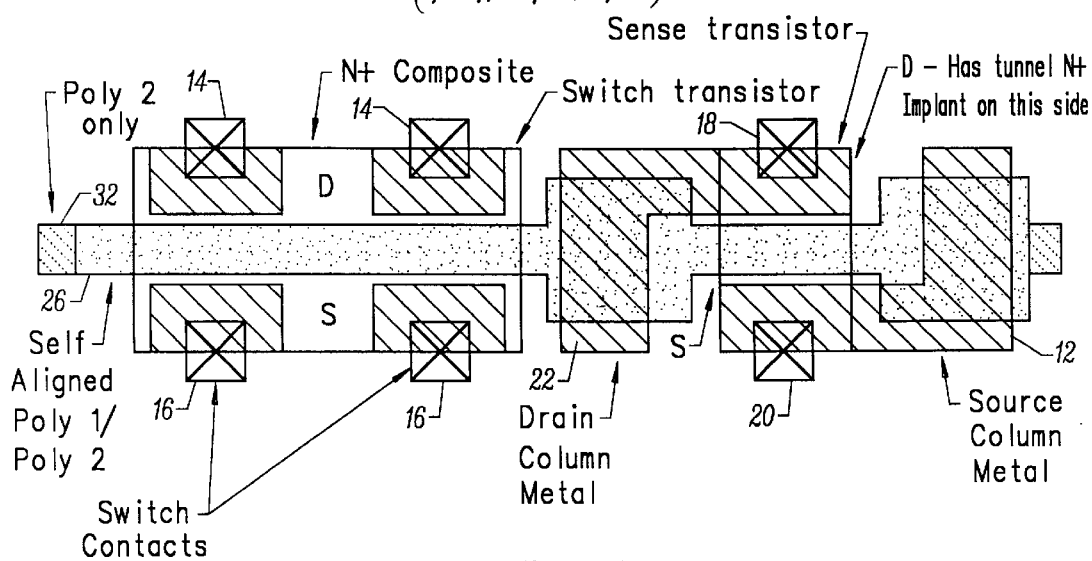
FIG. 4 is a plan view illustrating the layout of the FPGA cell of FIG. 1.

FIG. 4 is a plan view of the layout of the FPGA cell of FIG. 1. Switch transistor 10 and sense transistor 12 are in spaced horizontal aligmnents in a semiconductor wafer with floating gate 26 comprising a first polysilicon line (poly 1) overlying the channel region between the source and drain of transistor 10 and the source and drain of sense transistor 12. The poly 1 line terminates on either side of the cell and dos not continue to adjacent cells. The control gates 28–30 of the two transistors is provided by a second polysilicon line (poly 2) 32 which extends over the poly 1 line and is self-aligned therewith. The poly 2 line continues to all transistors in cells arranged in a row. The drain column line 22 is connected to contact 18 to the drain and continues vertically to contact the drain terminals of all sense transistors in a column. Similarly, the source column metal line 24 engages source contact 20 and extends vertically to contact all source regions of sense transistors in the column. Thus, in a column of FPGA cells, all sense transistor sources are connected to one column line, referred to as a source column, and all drains are connected to a second column line referred to as a drain column. The cell illustrated in FIG. 3 contains half of a shared source contact and half of a shared drain contact for adjacent sense devices, which also perform program and erase functions. As noted above, the sense device is required to test the programmed or erased state of each FPGA cell since the switch transistors are wired into the FPGA array and are not accessible.

As described above, the use of source/drains formed by dopant implant self-aligned with the floating gate and control gate can have limitations in electron tunneling. The use of buried source/drains in accordance with this invention overcomes these limitations. By forming the buried layers prior to polysilicon deposition for the gate structures, dopant can laterally diffuse from the buried layer to provide a graded junction, which lowers band-to-band tunneling leakage as well as facilitates programming electron tunneling.

Figure 5A:
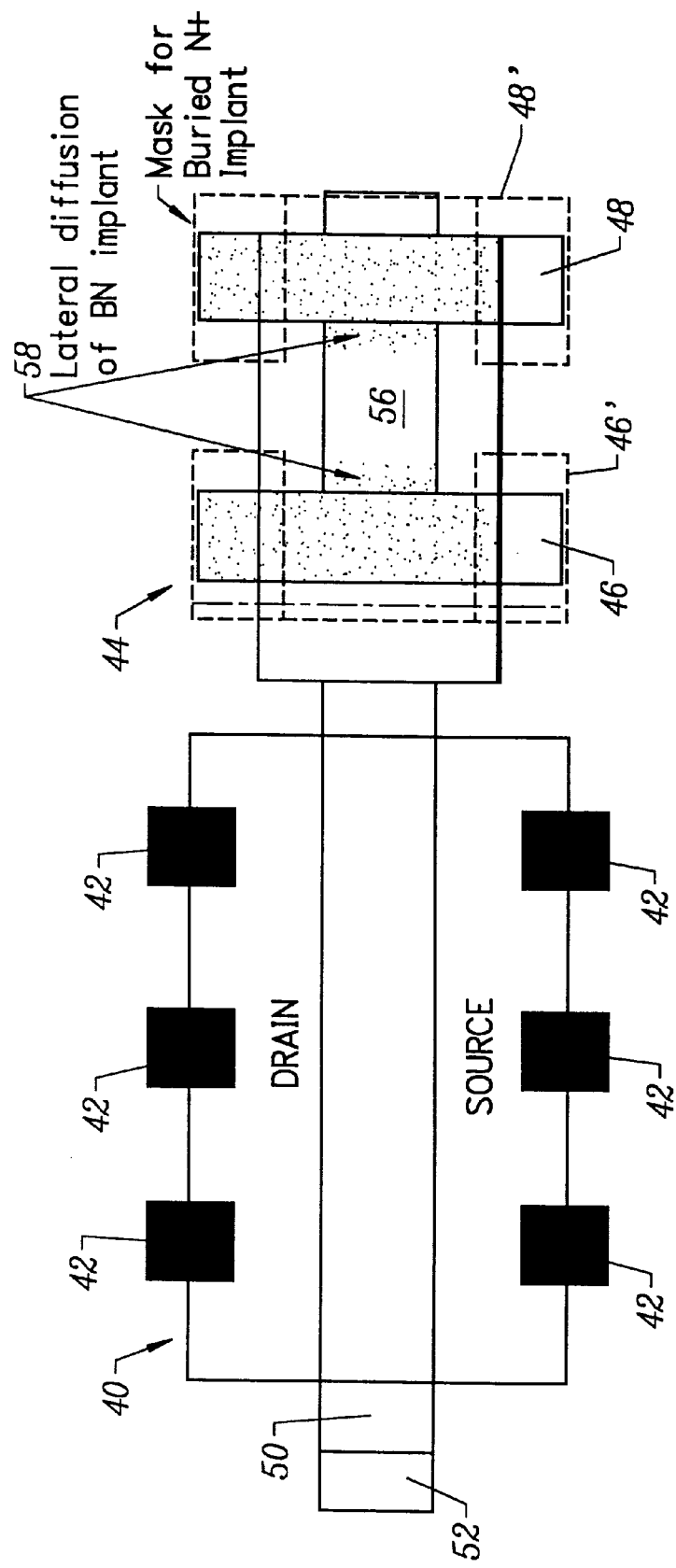
FIGS. 5A, 5B, and 5C are a cell plan view, an array of cells plan view, and an electrical schematic of an FPGA structure in accordance with the invention.
Figure 5B:
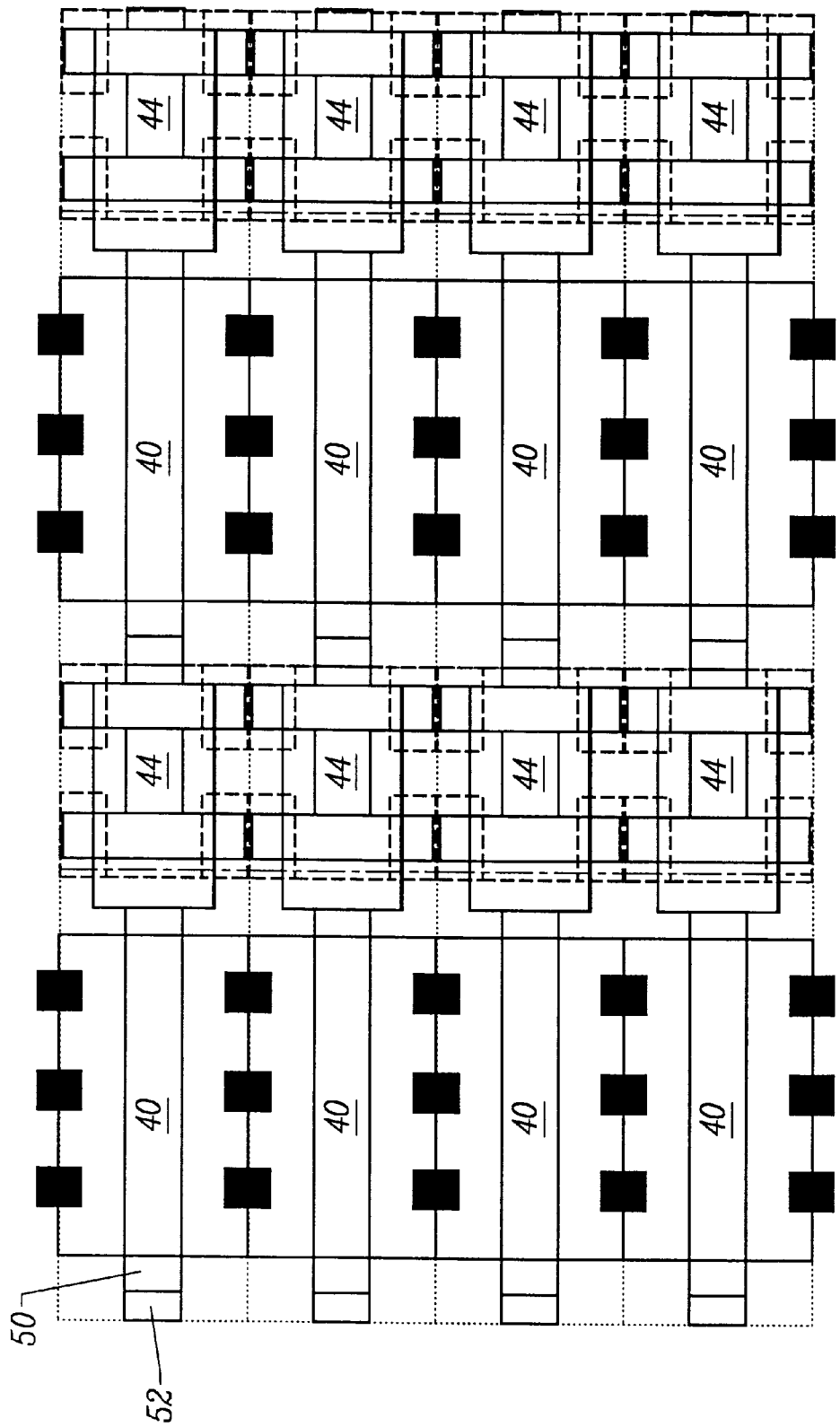
Figure 5C:
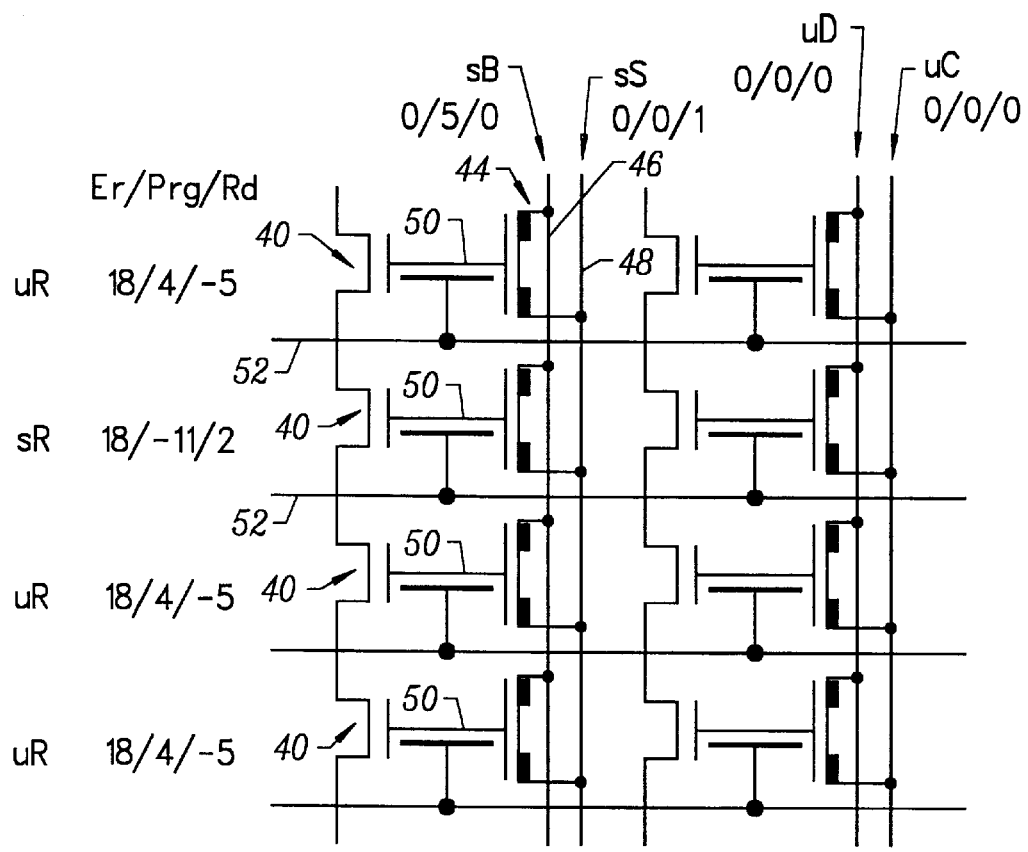

FIGS. 5A, 5B, and 5C are a cell plan view, an array of cells plan view, and an electrical schematic of an FPGA structure in accordance with the invention. In FIG. 5A, switch transistor 40 has source and drain regions which respectively have switch contacts 42, similar to the switch transistor in FIG. 1. The sense transistor 44 has a source region 46 and drain region 48 which are formed using a dopant implant mask for buried N+ implant for a P-doped substrate (2 e 15 at 15 Kev phosphorus) shown by dotted lines 46' and 48' for the source 46 and drain 48, respectively. The buried N+ source and drain are formed prior to formation of the polysilicon 1 floating gate 50 and the polysilicon 2 control gate 52 which run between the source and drain of switch transistor 40 and the source and drain of sense transistor 44. The subsequent polysilicon processing causes lateral dopant diffusion for drain 46 and source 48 into the channel region 56 between the source and drain, as shown at 58.

FIG. 5B is a plan view of a portion of a FPGA array using the cell structure of FIG. 5A, and FIG. 5C is an electrical schematic of the array. In FIG. 5B the cells are laid out laterally with polysilicon control gate 52 extending laterally across all cells. The floating gates 50 are restricted to each cell. The source and drain buried lines 46 and 48 run vertically to all sense transistors stacked in a column.

Illustrated in the electrical schematic of FIG. 5C are the respective control gate voltages for erase/program/read (Er/Prg/Rd) for unselected rows (uR) and for selected rows (sR). The voltages are for a cell structure having 0.25 micron gate width, Vcc of 2.5 volts, and Vtp=[−2 volt, =2 volt].

For erasing a cell by injecting electrons to the floating gate, the control gate is raised to 18 volts while the selected bitline (sB) and the selected column (sC) are grounded. Unselected Bitlines (uB) and unselected Columns (uC) are also grounded.

For a programming operation in which electrons are removed from the floating gate, −11 volts is applied to the control gate for the selected Row (sR) while all other control gates (uR) are grounded or raised to a positive voltage (e.g. 0 to +5 volts) to prevent Bitline disturb. The bitline for the column to be programmed (sB) is raised to +5 volts while the selected column (sS) is grounded whereby electrons flow from the floating gate to the bitline. All other bitlines (uD) and column lines (uC) are grounded.

For a Read operation, the selected row (sR) receives 2 volts and unselected rows receive −5 volts on the control gate. All bitlines are grounded, while the selected column (sC) receives 1 volt. Conducting or non-conducting state of the selected cell is then monitored.

The described FPGA cell and array are readily fabricated using conventional EEPROM-CMOS processing with few masks. By providing buried N+ bitlines for the sense transistor source/drains prior to polysilicon gate fabrication, electron tunneling in the channel region is facilitated and graded source/drain junctions lower band-to-band tunneling leakage.

While the invention has been described with references to specific embodiments, the description is illustrative of the invention and is not to be construed as limiting the invention. Various modifications and applications may occur to those skilled in the art without departing from the true scope and spirit of the invention as defined by the appended claims.

What is claimed is:

1. A programmable interconnect or selectively connecting circuit nodes in an integrated circuit comprising:

a first field effect transistor having first and second source/drains connected to a first and second circuit node, a floating gate for storing charge, and a control gate for turning said first field effect transistor on and off responsive to charge on the floating gate, a second field effect transistor having first and second source/drains, a floating gate separated from at least one source/drain by tunneling silicon dioxide, and a control gate capacitively coupled to the floating gate, the floating gate of the first and second field effect transistors being interconnected, the source/drains of the second field effect transistor including by buried doped regions formed before formation of the floating gate and the control gate, and a first conductive line and a second conductive line connected to the first and second source/drains of the second field effect transistor, whereby programming of the interconnect is effected by applying voltages to the first and second conductive lines and to the control gate of the second field effect transistor, and the sensing of conducting and non-conducting states of a node is by selectively monitoring conduction of the second field effect transistor through the first conductive line and the second conductive line.

2. The programmable interconnect as defined by claim 1 wherein said floating gates comprise a first polysilicon line running between and spaced from the source/drains of the first field effect transistor and running between and spaced from the source/drains of the second field effect transistor.

3. The programmable interconnect as defined by claim 2 wherein said control gates comprise a second polysilicon line extending to adjacent programmable interconnects in an array of programmable interconnects.

4. The programmable interconnect as defined by claim 3 wherein the first and second conductive lines comprise doped buried lines running perpendicular to the first polysilicon line and the second polysilicon line.

5. The programmable interconnect as defined by claim 4 wherein the first polysilicon line is restricted to the first field effect transistor and the second field effect transistor.

6. A programmable interconnect as defined by claim 5 wherein the first polysilicon line and the second polysilicon line are self-aligned.

7. The programmable interconnect as defined by claim 6 wherein the first field effect transistor is formed in a first region of a semiconductor body, the second field effect transistor is formed in a second region of the semiconductor body adjacent to the first region.

8. An array of programmable interconnects for selectively connecting circuit nodes in an integrated circuit comprising a plurality of interconnect cells arranged in rows and columns and each programmable to connect and disconnect circuit nodes, each cell having a first field effect transistor aligned with first field effect transistors of cells in a first column, and a second field effect transistor aligned with second field effect transistors of cells in a second column, the first and second field effect transistors of a cell being aligned with first and second field effect transistors of cells in the same row, source/drains of the second field effect transistor comprising buried doped layers in a semiconductor substrate, each cell having a first polysilicon line running between and spaced from source/drains of the first field effect transistor and between and spaced from source/drains of the second field effect transistor and functioning as a common floating gate for the first and second field effect transistors, a second polysilicon line overlying the first polysilicon line and functioning as a common control gate for the first and second field effect transistors, the second polysilicon line extending to other cells in a row, whereby programming of a cell is effected by applying voltages to the source/drains of the second field effect transistor and to the second polysilicon line, and the sensing of conducting and non-conducting states of a node is by selectively monitoring conductance of the second field transistor of the cell through first and second metal lines.

\* \* \* \* \*